(12) United States Patent
Nakamura et al.

(10) Patent No.: US 6,222,303 B1
(45) Date of Patent: Apr. 24, 2001

(54) PIEZOELECTRIC ACTUATOR HAVING AN ARRAY OF DRIVE COLUMNS

(75) Inventors: Hirofumi Nakamura; Torahiko Kanda, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/247,599

(22) Filed: Feb. 10, 1999

(30) Foreign Application Priority Data

Feb. 12, 1998 (JP) .................................................. 10-029997

(51) Int. Cl.[7] .................................................... H01L 41/04
(52) U.S. Cl. ......................... 310/328; 310/366; 310/367
(58) Field of Search ........................ 310/328, 330–332, 310/334, 358, 359, 366, 367, 324

(56) References Cited

U.S. PATENT DOCUMENTS

| 4,633,121 | * | 12/1986 | Ogawa et al. | 310/366 X |
|---|---|---|---|---|
| 5,165,809 | * | 11/1992 | Takahashi et al. | 310/328 X |
| 5,381,171 | * | 1/1995 | Hosono et al. | 310/366 X |
| 5,598,050 | * | 1/1997 | Bowen et al. | 310/331 X |
| 5,629,578 | * | 5/1997 | Winzer et al. | 310/334 |
| 5,745,278 | * | 4/1998 | La Fiandra | 310/366 X |
| 5,758,396 | * | 6/1998 | Jeon et al. | 310/334 X |
| 5,912,526 | * | 6/1999 | Okawa et al. | 310/366 X |
| 5,945,773 | * | 8/1999 | Nagashima | 310/328 |
| 5,983,471 | * | 11/1999 | Osawa | 310/328 X |

FOREIGN PATENT DOCUMENTS

| 196 05 214 | 8/1996 | (DE) . |
|---|---|---|
| 2 283 206 | 5/1995 | (GB) . |
| 3-243358 | 10/1991 | (JP) . |
| 3-266644 | 11/1991 | (JP) . |
| 4-341855 | 11/1992 | (JP) . |
| 7-117228 | 5/1995 | (JP) . |
| 7-156383 | 6/1995 | (JP) . |
| 8-25622 | 1/1996 | (JP) . |
| 8-52873 | 2/1996 | (JP) . |
| 8-80614 | 3/1996 | (JP) . |
| 8-156272 | 6/1996 | (JP) . |
| 8-174818 | 7/1996 | (JP) . |
| 8-192514 | 7/1996 | (JP) . |

* cited by examiner

*Primary Examiner*—Mark Budd
(74) *Attorney, Agent, or Firm*—Sughrue, Mion, Zinn, Macpeak & Seas, PLLC

(57) ABSTRACT

A piezoelectric actuator has a base, and an array of drive columns separated by grooves and each having a top surface for outputting a displacement force. Each of the drive columns is formed in a unitary body with an underlying portion of the base by a first block of a plurality of green sheets made of a piezoelectric material and stacked together. The base has additionally a second block of green sheets stacked between adjacent two of the first block at the portion of the base underlying the groove.

1 Claim, 10 Drawing Sheets

PIEZOELECTRIC ACTUATOR HAVING AN ARRAY OF DRIVE COLUMNS

BACKGROUND OF THE INVENTION (a) Field of the Invention

The present invention relates to a piezoelectric actuator having an array of drive columns and, more particularly, to a piezoelectric actuator that is especially suitable for ink jet printers, that can be fabricated with improved positional accuracy and increased integration density, and that can be stably driven. The present invention also relates a method for fabricating such a piezoelectric actuator.

(b) Description of the Related Art

Figure 1A:
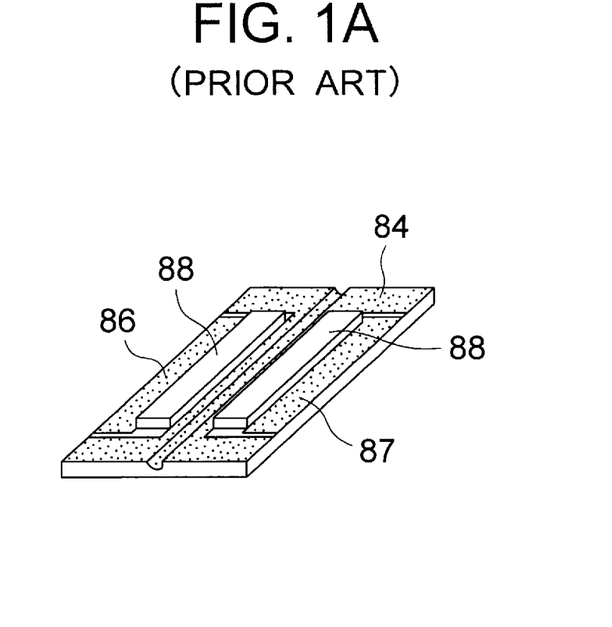
FIGS. 1A and 1B are perspective views of a conventional piezoelectric actuator, showing consecutive steps of fabricating the piezoelectric actuator.
Figure 1B:
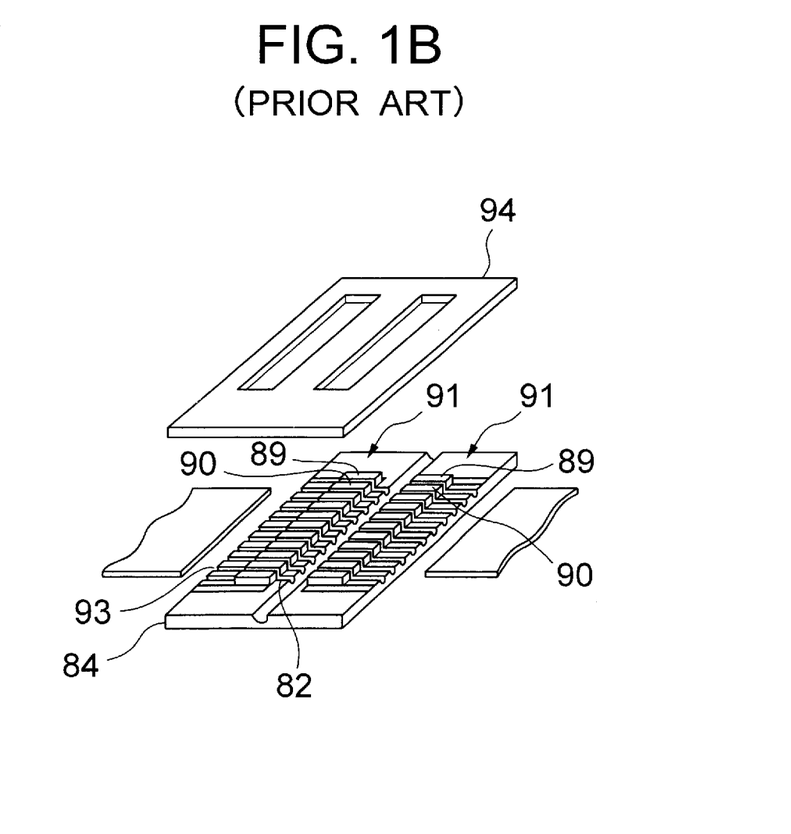

In ink jet printers, a piezoelectric actuator is generally used in the ink jet head of the ink jet printers for ejecting liquid ink therefrom. A conventional piezoelectric actuator for such an ink jet head is proposed in, for example, Patent Publication No. JP-A-96-156272. FIGS. 1A and 1B show the proposed piezoelectric actuator.

For fabrication of the piezoelectric actuator, a plurality of elongate piezoelectric plates 88 of a stacked structure are first bonded onto a substrate 84 along electrode plates 86 and 87 formed thereon, as shown in FIG. 1A.

Subsequently, a plurality of slits extending in a direction perpendicular to the longitudinal direction of the elongate piezoelectric plates 88 are formed in the piezoelectric plates 88 and on the surface portion of the substrate 84 at a predetermined pitch. Thus, a plurality of rows 91 are formed each having a plurality of stacked piezoelectric elements (or drive columns) 89 and 90. Subsequently, the electrode plates 86 and 87 are subjected to patterning to form a plurality of external signal electrodes 93 each corresponding to one of the piezoelectric elements 89, as shown in FIG. 1B.

Surface electrodes are then provided on the opposite side surfaces of each of the piezoelectric elements 89 and 90. The piezoelectric element has therein a plurality of layered internal electrode films including a plurality of signal electrodes and a plurality of common electrodes alternately disposed with each other. Each surface electrode of the piezoelectric elements connects the signal electrodes or common electrodes together. The surface electrode connecting the internal common electrodes together is connected via conductive material to an external common electrode 82 formed on the substrate 84, whereas the surface electrode connecting the internal signal electrodes together is connected via conductive material to an external signal electrode 93 formed on the substrate 84. Further, a support member 94 is disposed on and bonded to the substrate 84, the support member 94 having an opening for encircling each row of the piezoelectric elements 89 and 90 so that the top surface of the support member 94 is flush with the top surfaces of the piezoelectric elements 89 and 90. Each of the stacked piezoelectric elements 89 and 90 has a displacement output surface at the top thereof far from the substrate 84, and, due to the longitudinal piezoelectric effect, outputs a displacement in the same direction as the direction of the stacking.

In the conventional technique as described above, a plurality of piezoelectric elements are obtained after separation of the elongate piezoelectric plate by using slits extending in the transverse direction of the elongate piezoelectric plate. Thus, each piezoelectric element has a rectangular planar shape, and an ink chamber and a nozzle for ejecting liquid ink in association with the piezoelectric element should conform to the rectangular shape of the piezoelectric element. A pattern of external electrodes for each row of the piezoelectric elements is located on either side of the piezoelectric plates. This prevents a higher integration of the actuator unit, such as provision of three or more rows of piezoelectric elements on a single actuator unit, resulting in a difficulty in increasing the number of nozzles per unit area, as well as in a low productivity.

Further, since the material of the substrate differs from that of the piezoelectric element, it generates differences in the thermal expansion coefficient and in workability between the substrate and the piezoelectric element during machining of the slits.

Furthermore, a bonding process must be performed twice; i.e., when the piezoelectric plate is bonded onto the substrate and when the support member is bonded onto the substrate. In addition, when the piezoelectric plates are positioned relative to the external electrode patterns on the substrate before being bonded to the substrate, a positional deviation is often caused between the piezoelectric plates.

SUMMARY OF THE INVENTION

In view of the above, it is an object of the present invention to provide a piezoelectric actuator having a compact structure and including a plurality of piezoelectric elements formed with a higher integration and a higher positional accuracy.

It is another object of the present invention to provide a method for forming such a piezoelectric actuator.

The present invention provides a piezoelectric actuator comprising a base, an array of drive columns arranged on the base, each of the drive columns having a top surface for outputting a displacement force, and an external common electrode and an external signal electrode for each of the drive columns, each of the drive columns being formed in a unitary body with an underlying portion of the base by a first block of a plurality of green sheets made of a piezoelectric material and stacked together, the green sheets including first green sheets each having thereon a common electrode pattern in electrical contact with the external common electrode and second green sheets each having thereon a signal electrode pattern in electrical contact with the external signal electrode, the base having additionally a second block of third green sheets stacked between adjacent two of the first block.

The present invention also provides a method for manufacturing a piezoelectric actuator comprising the steps of: forming a plurality of green sheets made of piezoelectric material and each having thereon a common electrode pattern; forming a plurality of second green sheets made of piezoelectric material and each having thereon a signal electrode pattern; forming a plurality of third green sheets made of piezoelectric material; stacking the first through third green sheets such that the first green sheets and the second green sheets form a plurality of first block, the third green sheets form at least one second block, and the first blocks and second block are stacked alternately to form a stacked body; forming at least one first groove on the second block and at least one second groove intersecting the first groove to leave a plurality of drive columns separated by the grooves; forming an external common electrode and an external signal electrode for each of the drive columns, the external common electrode being in electric contact with corresponding common electrode patterns, the external signal electrode being in electric contact with corresponding signal electrode patterns.

In accordance with the piezoelectric actuator of the present invention or formed by the method of the present invention, the piezoelectric actuator has a compact size because of the unitary body of the base and the plurality of drive columns fabricated with a reduced cost and positional accuracy.

The above and other objects, features and advantages of the present invention will be more apparent from the following description, referring to the accompanying drawings.

DESCRIPTION OF THE PREFERRED EMBODIMENTS

Embodiments of the present invention will now be described in further detail with reference to the accompanying drawings.

First Embodiment

Figure 2A:
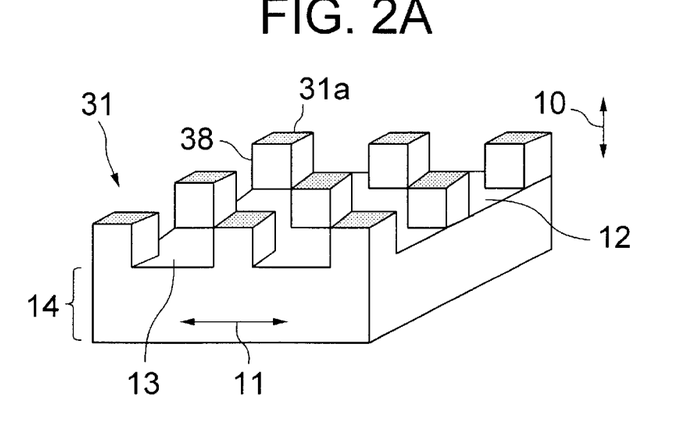
FIGS. 2A, 2B, and 2C are a perspective view, a top plan view, and a bottom view, respectively, of a piezoelectric actuator according to a first embodiment of the present invention.
Figure 2B:
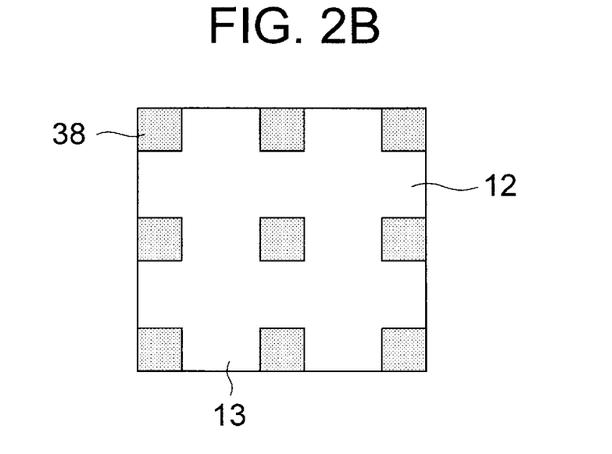
Figure 2C:
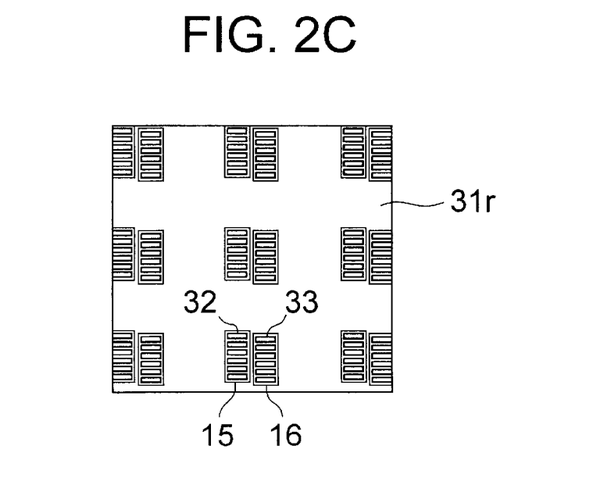

Referring to FIGS. 2A–2C showing a perspective view, a top plan view and a bottom view, respectively, of a piezoelectric actuator 31 according to a first embodiment of the present invention, the piezoelectric actuator 31 has a plurality of drive columns 38 each having a shape of a square pole and are separated from one another by grooves 12 and 13 arranged in a grid pattern as viewed from the top of the piezoelectric actuator 31, and a planar base portion 14 for supporting the bottom of the drive columns 38. Each of the drive columns 38 functions as a piezoelectric drive mechanism. The piezoelectric actuator 31 has a laminated structure of a plurality of green sheets made of piezoelectric material and stacked in the direction from the rear side of the piezoelectric actuator 31 to the front side thereof. The green sheets include first green sheets each having thereon a common electrode pattern and second green sheets each having thereon a signal electrode pattern.

On the bottom surface 31r of the piezoelectric actuator 31, a plurality of common electrode patterns 32 are connected to an external common electrode film 15 formed for each drive column 38, whereas a plurality of signal electrode patterns 33 are connected to an external signal electrode film 16 formed for each drive column 38. Each drive column 38 has at the top thereof a displacement surface 31a, through which a displacement force is output to the outside in the direction of the drive column 38 due to the transverse piezoelectric effect.

Figure 3:
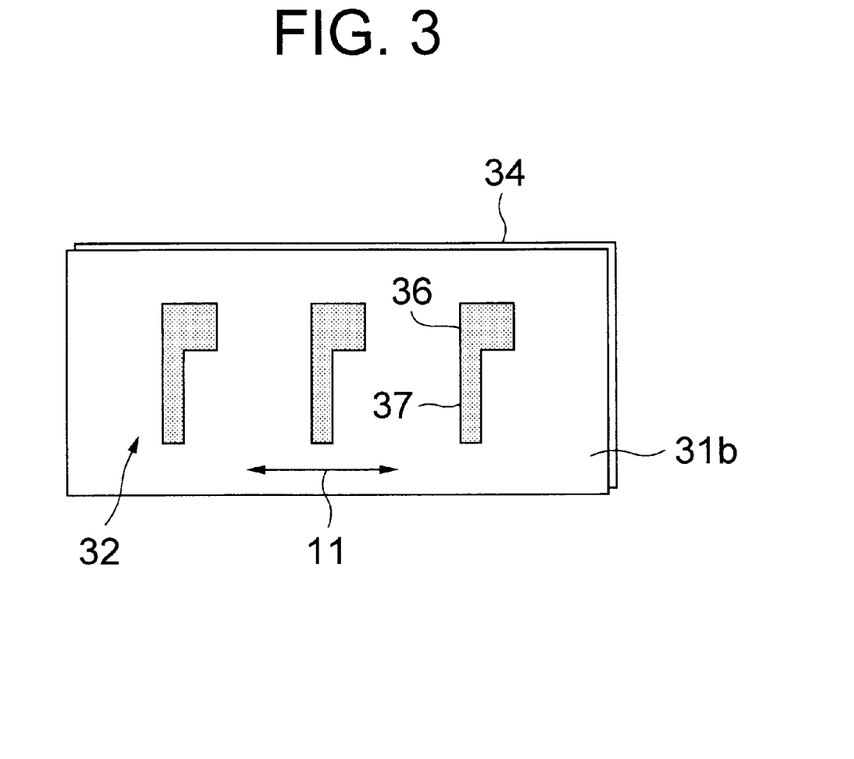
FIG. 3 is a top plan view of a piezoelectric green sheet having thereon a plurality of common electrode patterns.
Figure 4:
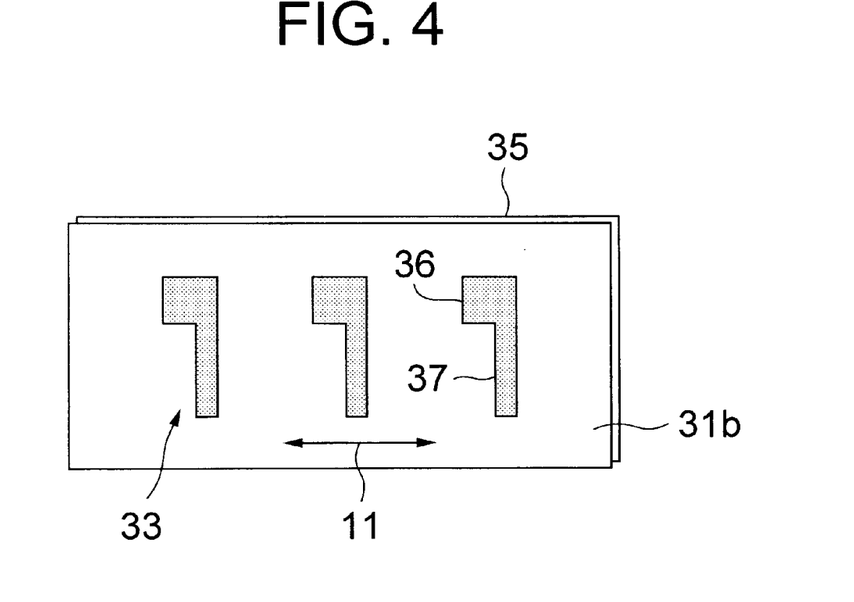
FIG. 4 is a top plan view of a piezoelectric green sheet having thereon a plurality of signal electrode patterns.

FIG. 3 shows one of the green sheets made of piezoelectric material for forming the piezoelectric actuator of FIG. 2A, wherein the green sheet 34 shown therein has a plurality of common electrode patterns 32 formed by application of conductive paste onto the green sheet 34 and subsequent patterning thereof. FIG. 4 shows another of the green sheets for forming the piezoelectric actuator of FIG. 2A, the green sheet 35 shown therein has a plurality of signal electrode patterns 33 formed by application of conductive paste onto the green sheet 35 and subsequent patterning thereof. The piezoelectric actuator 31 having the drive columns 38 is of a stacked structure, in which green sheets 34 having the common electrode patterns 32 and the green sheets 35 having the signal electrode patterns 33 are alternately stacked in a direction perpendicular to the green sheets 34 and 35.

Each of the common electrode pattern 32 and the signal electrode pattern 33 includes a drive electrode section 36 that drives the drive column 38 together with other drive electrode section 36, and a lead section 37 which is connected to the drive electrode section 36 and has a bottom end that appears from the bottom surface 31r of the piezoelectric actuator 31, as shown in FIG. 2C. The common electrode patterns 32 and the signal electrode patterns 33 are disposed at such positions that their drive electrode sections 36 overlap each other, and their lead sections 37 do not overlap each other, as viewed in the stacking direction. In the bottom surface 31r shown in FIG. 2C, the ends of lead sections 37 of the common electrode patterns 32 are aligned in a row for each drive column 38, and the ends of the lead sections 37 of the signal electrode patterns 33 are also aligned in another row for each drive column 38.

In the present embodiment, three common electrode patterns 32 and three signal electrode patterns 33 are formed on each green sheet 34 or 35 in this example. However, these numbers may be arbitrarily selected in accordance with a desired number of the drive columns 38 arranged in the direction 11. In the present embodiment, the piezoelectric material for the green sheet 34 or 35 is made from a mixture of lead zirconate titanate ceramics and an organic binder. However, a ferroelectric-material or the like generally used as a piezoelectric material may be used instead. The green sheet 34 or 35 can be formed by a doctor blade technique to have a thickness of about 30 micrometers (μm). However, the green sheet may have a thickness corresponding to a desired amount of displacement of the piezoelectric actuator 31.

The method for fabricating the piezoelectric actuator 31 will now be described. First, a green sheet 34 on which common electrode patterns 32 have been formed and a green sheet 35 on which signal electrode patterns 33 have been formed are stacked on each other such that the drive electrode sections 36 of the electrode patterns 32 and 33 come into alignment with each other and the lead portions 37 of the common electrode patterns 32 do not overlap the lead sections 37 of the signal electrode patterns 33, to form a electrode sheet block. The electrode sheet block includes twenty of green sheets 34 and 35 in this example. Separately, a plurality of green sheets on which no electrode pattern is formed are stacked on one other to form a blank sheet block having no drive electrode portions. The blank sheet block also includes twenty of green sheets. The common electrode patterns 32 and the signal electrode patterns 33 are preferably made of silver-palladium paste applied to the green sheet or other conductive material formed by evaporation.

Figure 5A:
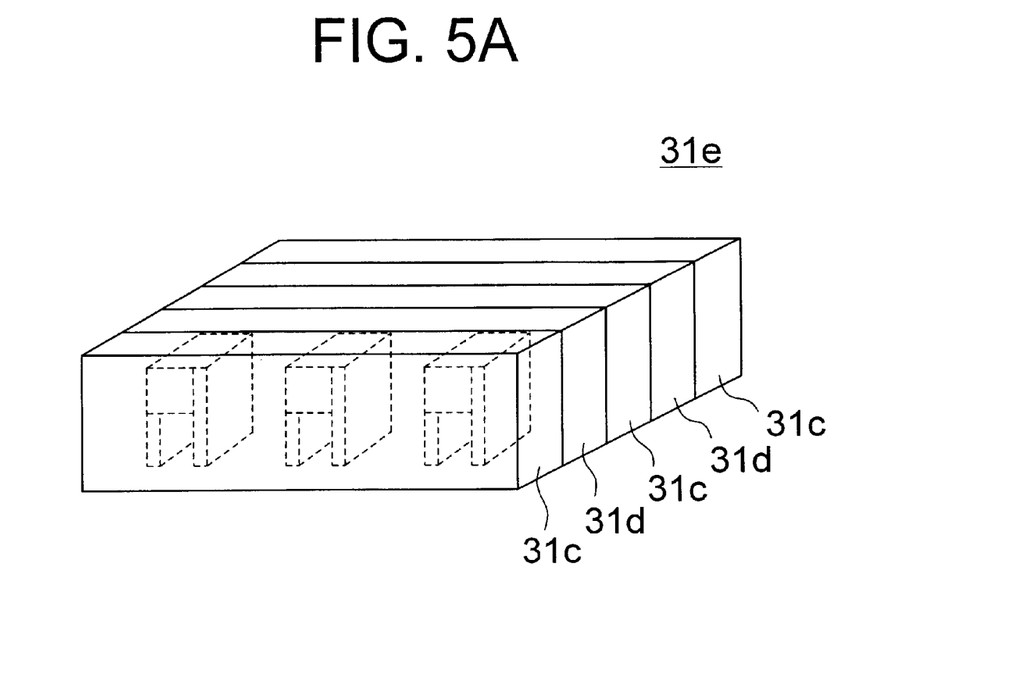
FIGS. 5A and 5B are a perspective view and a top plan view, respectively, of the stacked body used in the piezoelectric actuator of the first embodiment.
Figure 5B:
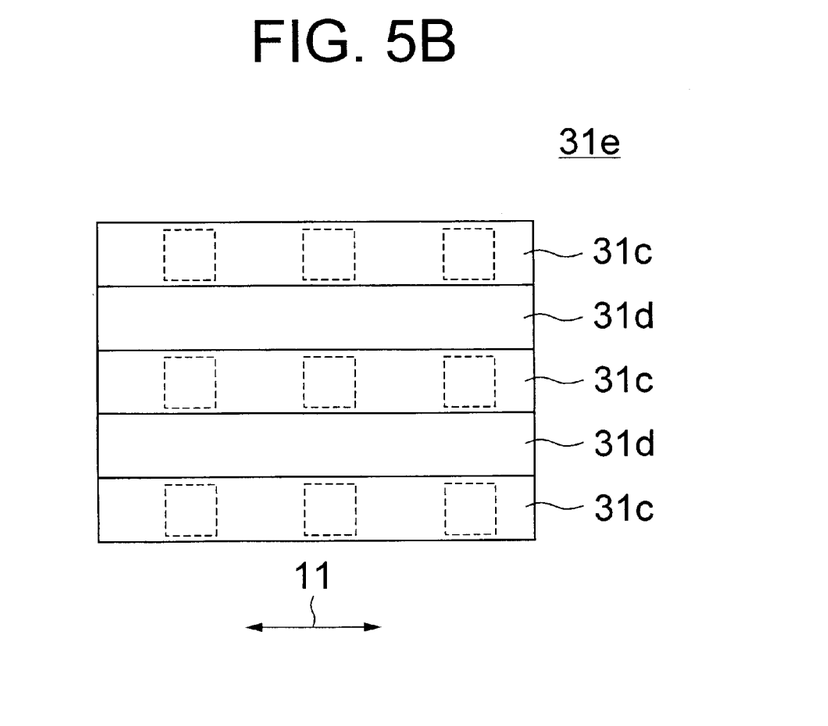

Subsequently, as shown in FIGS. 5A and 5B, three electrode sheet blocks 31c and two blank sheet blocks 31d are alternately stacked to form a stacked sheet body 31e. For simplicity, in FIG. 5A, among the electrode sheet blocks 31c including electrode patterns, only the electrode patterns of the front sheet block 31c are depicted by broken lines. As a result of alternate stacking of the sheet blocks 31c and 31d, as shown in FIG. 5B, three drive columns-to-be are arranged along the direction 11 parallel to the green sheets as well as along the direction perpendicular to the direction 11. A larger or lower number of sheet blocks 31c and 31d may be stacked in accordance with a desired arrangement of the drive columns 38.

Subsequently, pressure together with heat is applied to the stacked sheet blocks by a hot press technique in order to unify the stacked sheet blocks 31c and 31d to form a unitary body. A large amount of organic binder resin included in the stacked body 31e necessitates a process for removing the binder resin, followed by sintering the unitary body at 1100° C., for example.

Subsequently, by use of a dicing saw, the sintered body 31e is cut into desired dimensions to serve as a piezoelectric actuator unit. In consideration of the necessity of positioning the stacked body before the grooves are formed for separation of the drive columns 38, the sintered body is cut such that the edges of the common electrode patterns 32 and the signal electrode patterns 33 are exposed at the displacement output surface 31a. Further, external machining is performed such that the edges of the lead sections 37 are exposed from the bottom surface 31r of the sintered body.

Subsequently, by use of a dicing saw, grooving is performed in order to shape the drive columns 38 which include drive electrode sections 36 therein. Specifically, a plurality of grooves 12 each having the same width as the thickness of the stacked blank sheet 31d are formed between the drive columns 38 such that the grooves 12 extend along the direction 11 parallel to the green sheet. The groove 12 are formed by cutting the unitary body to a depth of 1 mm from the top surface thereof. Subsequently, a plurality of grooves 13 each having a width corresponding to the distance between adjacent drive electrode sections 36 are formed along the stacking direction of the internal electrodes perpendicular to the grooves 12. Thus, a plurality of drive columns 38 are completed (see FIGS. 2A and 2B).

By the steps described above, the drive columns 38 are formed from the same material as that of the base portion of the piezoelectric actuator 31 in a unitary body therewith. Thus, a piezoelectric actuator 31 is obtained having a plurality of drive columns 38 disposed in matrix on a common base. Exemplified dimensions of the piezoelectric actuator 31 formed by the above steps are as follows. The grooves 12 and 13 have a width of 0.718 mm, and each side of each drive column 38 is 0.3 mm. Further, the pitch of the drive columns 38 is 1.018 mm in the direction 11 as well as in the direction perpendicular to the direction 11. However, these dimensions may be arbitrarily selected in accordance with a desired pitch of the drive columns 38 and other factors.

Subsequently, surface electrodes (or external electrodes) for applying drive voltage to the internal electrode patterns of the drive columns 38 are formed as follows. For each drive column 38, the end surfaces of the lead sections 37 of the common electrode pattern 32 and the end surfaces of the lead sections 37 of the signal electrode pattern 33 are exposed at the bottom surface 31r. Subsequently, silver paste is applied onto these end surfaces to form surface electrodes 15 and 16 in FIG. 2C. Further, an FPC cable (unillustrated) is connected to the surface electrodes. The FPC cable has a pattern that allows selective application of voltage between the common electrode pattern 32 and the signal electrode pattern 33 of each drive column 38. As a result, each drive column 38 can be driven independently of one another. In place of the above method, evaporation of conductive metal, printing of conductive paste, or any other suitable method may be used to form the surface electrodes.

In operation, a voltage is applied between the surface electrodes 15 and 16 on the bottom surface 31r of each drive column 38 via the FPC cable. As a result, a voltage difference is generated between the drive electrode section 36 of the common electrode pattern 32 and the drive electrode portion 36 of the signal electrode pattern 33. Thus, due to the transverse piezoelectric effect, displacement in the vertical direction 10 is output from the displacement output surface 31 a of the drive column 38.

The piezoelectric actuator 31 of the present embodiment can be made compact and allows individual displacements of the drive columns 38. The piezoelectric actuator 31 may have another structure in which, in place of the common electrode patterns 32 and the signal electrode patterns 33, there are provided common electrode patterns and signal electrode patterns that are stacked in the depthwise direction of the grooves with an intervention of green sheets of a piezoelectric material, and each drive column has at the top thereof a displacement output surface, through which displacement is output in the height direction of the drive column 38 due to the longitudinal piezoelectric effect.

Figure 11:
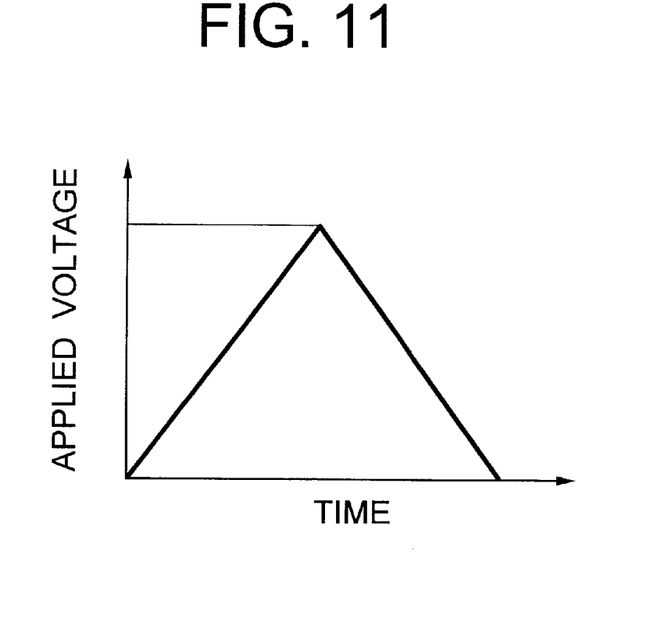
FIG. 11 is a timing chart showing a waveform of a voltage applied between the common electrode and the signal electrode.
Figure 12:
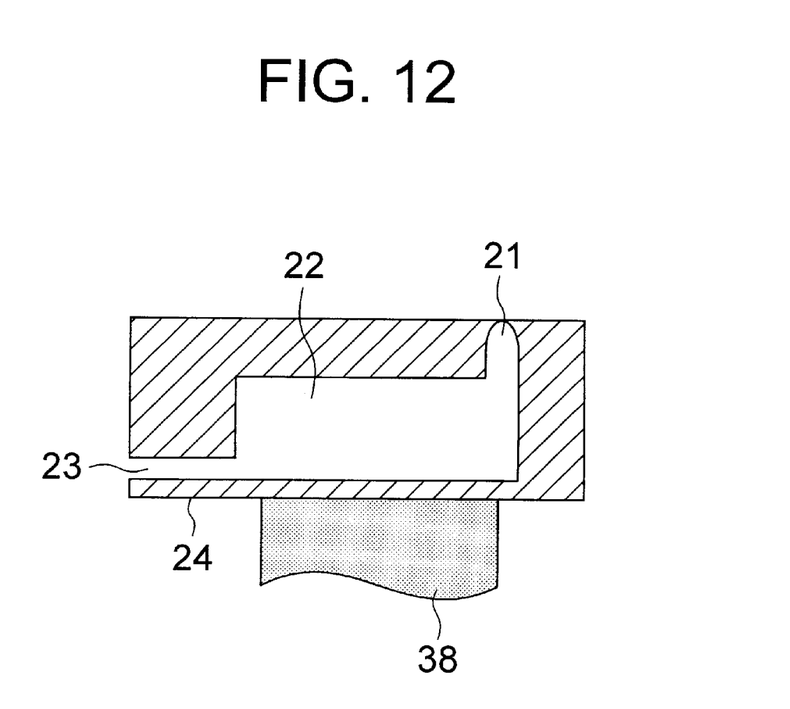
FIG. 12 is a sectional view of an ink jet head having the piezoelectric actuator of the first embodiment installed therein.

Referring to FIG. 11, there is shown a drive voltage waveform applied to the piezoelectric actuator 31 of the present embodiment, wherein the applied voltage is of a triangle waveform. Each of the drive columns 38 in the piezoelectric actuators 31 of the present embodiment exhibited a maximum output of about 0.3 micrometers when applied with the illustrated drive voltage, wherein the maximum output is equivalent among the drive columns 38. The piezoelectric actuator 31 was also installed in an ink jet head, such as shown in FIG. 12. The ink jet head had a plurality of pressure chambers 22 each communicated with an ink jet nozzle 21 and an ink inlet passage 23, and a vibration plate 24 defining a wall of the pressure chamber 22 and attached with a drive column 38 of the piezoelectric actuator 31 at the outer surface of the vibration plate 24. A voltage having a waveform shown in FIG. 11 was applied to the drive column 38, whereby ink droplets can be stably ejected from all the ink jet nozzles 21.

Second Embodiment

Figure 6:
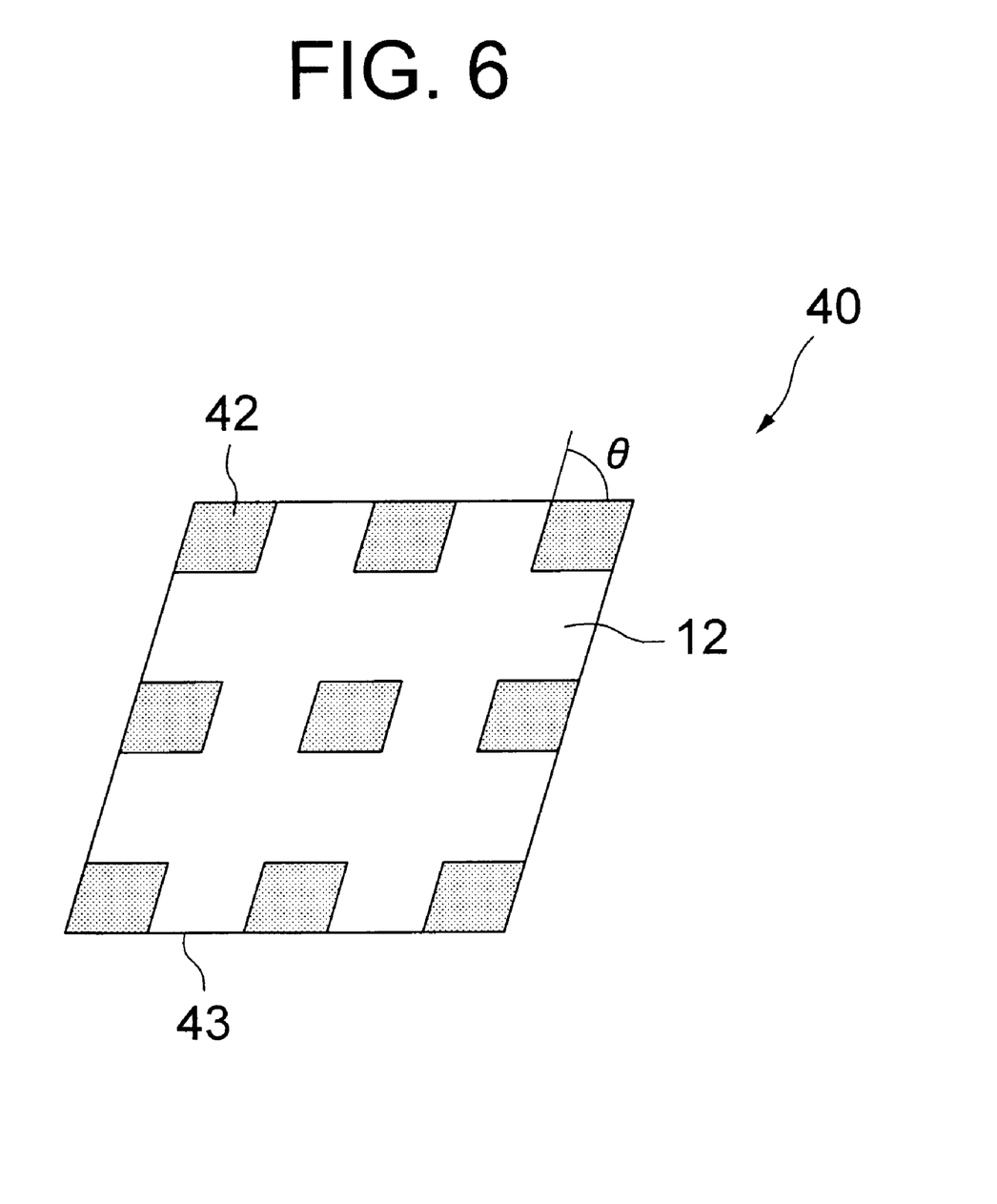
FIG. 6 is a top plan view of a piezoelectric actuator according to a second embodiment of the present invention.

Referring to FIG. 6, a piezoelectric actuator 40 according to a second embodiment is similar to the first embodiment, except that the base plate 43 as well as the drive columns 42 are rhombic as viewed from the top, wherein two adjacent sides form therebetween an angle of θ=85°. The grooves 12 are arranged in a substantially grid pattern such that the grooves 12 intersect at the angle θ. The angle θ may be in a range between 45 and 90°.

The piezoelectric actuator 40 of the present embodiment is fabricated similarly to the first embodiment, except that the green sheets each having thereon an electrode pattern are arranged such that the electrode patterns are consecutively shifted in the same direction from the adjacent electrode patterns by a specified distance as viewed from the front side of the actuator 40. The specified distance corresponds to a desired angle θ and the thickness of the green sheet. The piezoelectric actuator 40 thus fabricated exhibited a maximum output of 0.3 micrometers at the applied voltage of FIG. 11, similarly to the first embodiment. An ink jet head of FIG. 12 having the piezoelectric actuator of the present embodiment exhibited excellent performance, similarly to the first embodiment.

Third Embodiment

Figure 7A:
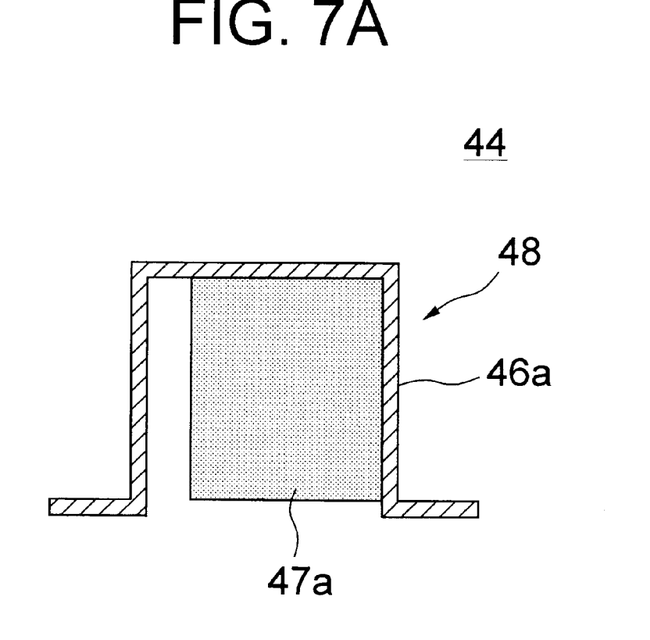
FIGS. 7A and 7B are top plan views of piezoelectric green sheets having a common electrode pattern and a signal electrode pattern, respectively, in a piezoelectric actuator according to a third embodiment of the present invention.
Figure 7B:
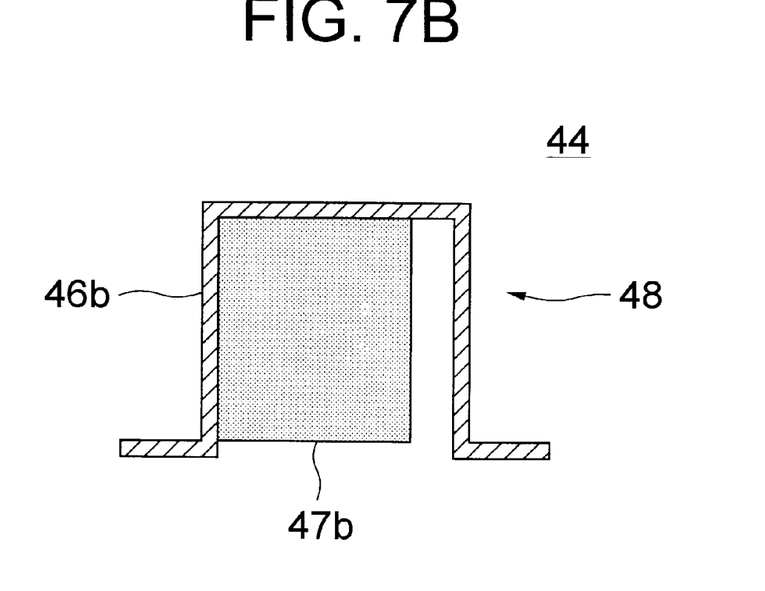

A piezoelectric actuator according to a third embodiment of the present invention has surface electrodes formed on the side surfaces of each drive column. Specifically, referring to FIG. 7A showing a first green sheet having thereon a common electrode pattern 47a and FIG. 7B showing a second green sheet having thereon a signal electrode pattern 47b, the edges of both the electrode patterns 47a and 47b are exposed at the opposite side surfaces of each drive column 48. Other configuration is similar to the first embodiment. The surface electrode for the internal common electrode patterns is formed on the side surface 46a whereas the surface electrode for the internal signal electrode patterns is formed on the side surface 46b.

The piezoelectric actuator 44 of the present embodiment is fabricated similarly to the first or second embodiment, except that the green sheets are stacked such that rectangular common electrode pattern and rectangular signal electrode pattern are deviated from each other by a specified distance. After the grooves are formed by dicing or other mechanical machining, the edges of both the electrode patterns 47a and 47b are exposed from opposite side surfaces 46a and 46b of the drive column 48.

Unlike the case of the first and second embodiments, the piezoelectric actuator 44 of the present embodiment obviates the step for dicing at the bottom surface of the actuator for exposing the lead sections, which reduces the waste amount of the piezoelectric material due to the dicing, and thus reduces the cost of the piezoelectric actuator.

Fourth Embodiment

Figure 8:
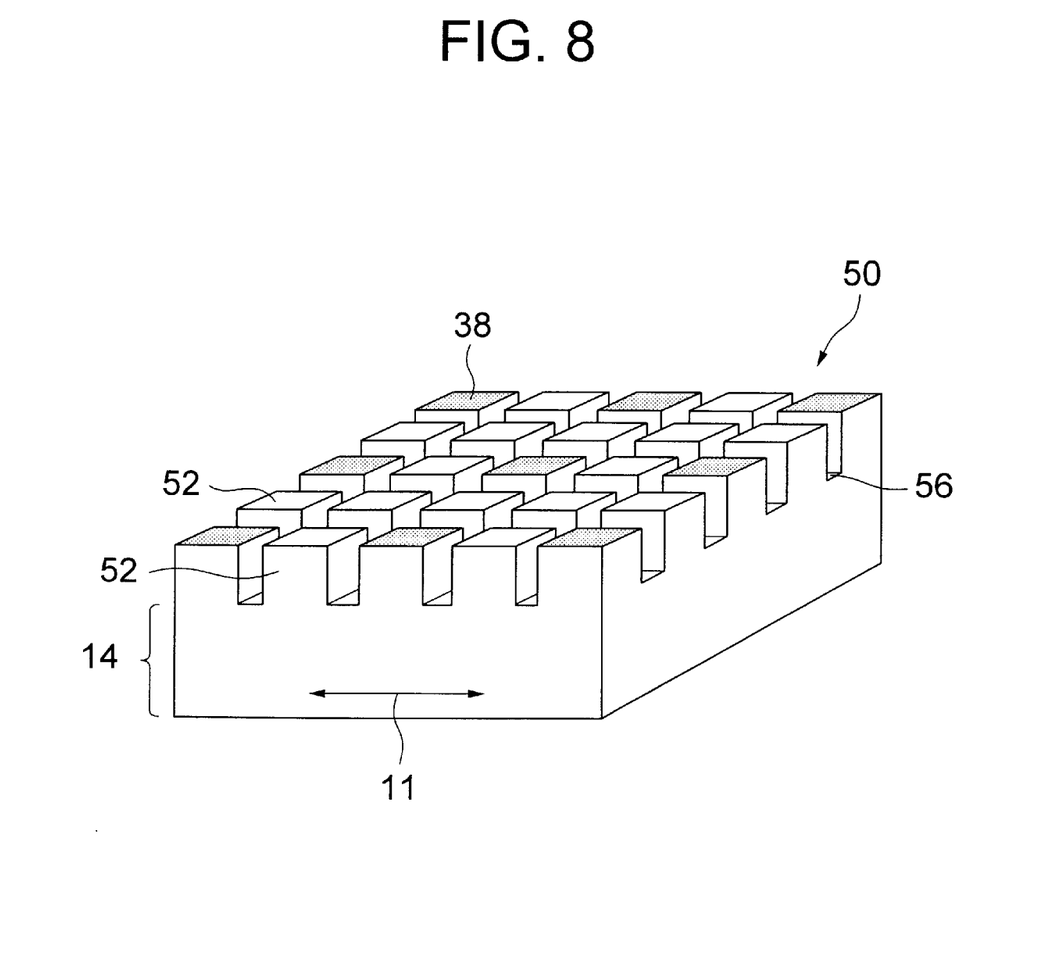
FIG. 8 is a perspective view of a piezoelectric actuator according to a fourth embodiment of the present invention.

Referring to FIG. 8 showing a piezoelectric actuator according to a fourth embodiment of the present invention, the piezoelectric actuator 50 has a plurality of or non-drive support columns 52 in addition to the drive columns 38, the non-drive support columns 52 having dimensions and a shape similar to those of the drive columns. The non-drive support columns 52 have, however, no internal electrodes therein and therefore function only as support members. In this example, the actuator 50 includes a first row and a second row both extending in the direction 11 and disposed alternately with each other. The first row includes drive columns 38 and non-drive support columns 52 arranged alternately with each other, whereas the second row includes only the non-drive support columns 52. Exemplified dimensions are such that the drive columns 38 and the dummy columns 52 have a side of 0.3 mm, the grooves 56 have a width of 0.209 mm, the pitch of the drive columns 38 is 1.018 mm in both the directions, although these dimensions may be changed in accordance with a desired pitch of the drive columns 38 and other factors.

As in the first and second embodiments, the piezoelectric actuator 50 according to the present embodiment was installed in an ink jet head, and a test was performed in order to compare, in terms of the performance of ejecting liquid ink droplets, the case where the support columns 52 were provided and the case where the support columns 52 were not provided. The test results demonstrated that the provision of the support columns 52 suppresses deformation of other portions, thereby allowing effective use of the output displacement of each drive column 38 and decreasing crosstalk. That is, the output displacement required for ejecting liquid ink is decreased, and variation in the ejecting characteristics of the nozzles is also decreased.

Fifth Embodiment

Figure 9A:
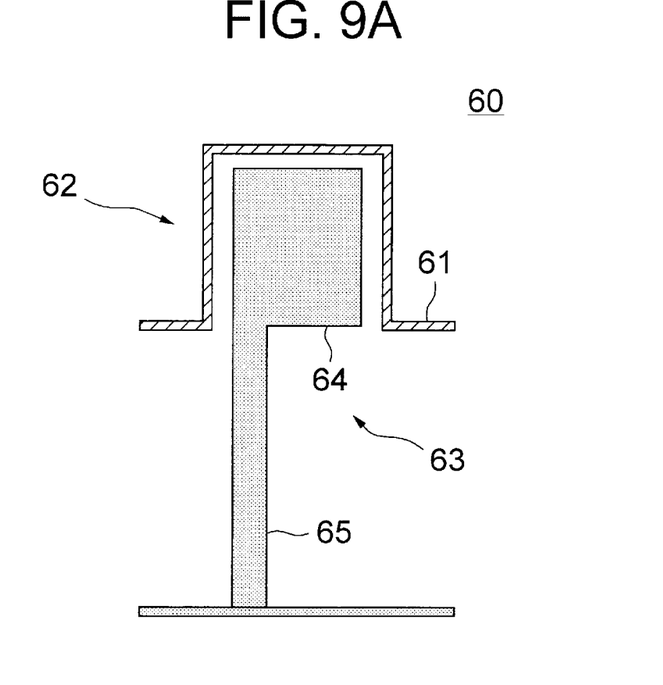
FIGS. 9A and 9B are top plan views of piezoelectric green sheets having a common electrode pattern and a signal electrode pattern, respectively, in a piezoelectric actuator according to a fifth embodiment of the present invention.
Figure 9B:
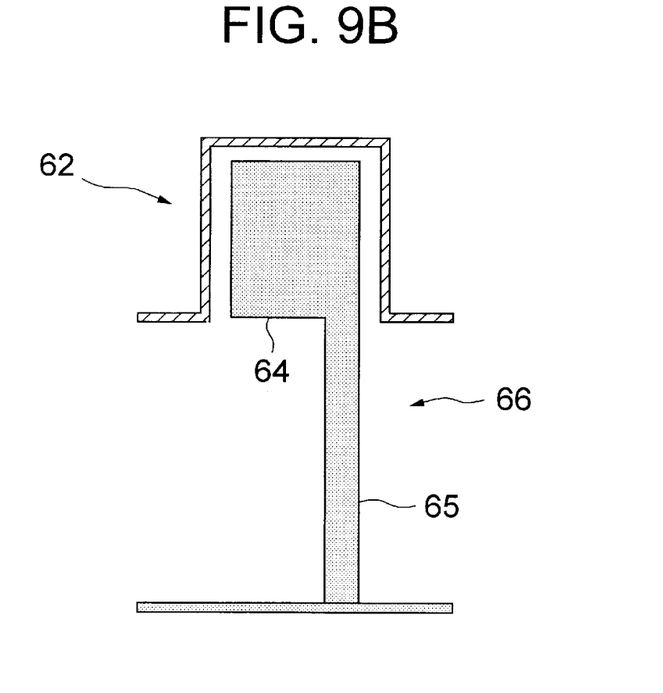

A piezoelectric actuator according to a fifth embodiment has internal electrodes exposed only at the bottom surface of the piezoelectric actuator. Specifically, referring to FIG. 9A showing a common electrode pattern 63 in a drive column 62 and FIG. 9B showing a signal electrode pattern 66 in the drive column 62, each of the electrode patterns 63 and 64 has a drive electrode section 64 and a lead section 65. The drive electrode section 64 has a bottom edge flush with the bottom of the groove 61 and is entirely received within the drive column 62, whereas the lead section 64 has an edge exposed at the bottom of the piezoelectric actuator 60. By this configuration, the drive columns 62 do not have exposed electrode patterns, thereby preventing a short-circuit failure at the outer surface of the drive columns 62 to improve the lifetime of the actuator 60.

The piezoelectric actuator 60 of the fifth embodiment can be modified such that the grooves 61 have a larger depth. That is, the bottom of the groove 61 is lower than the bottom edge of the electrode section 64 of the electrode pattern 63 or 66. This configuration provides a further improvement of the lifetime because the stress concentration can be alleviated in the modified embodiment.

The piezoelectric actuator 60 of the fifth embodiment may be further modified such that the bottom of the groove 61 is higher than the bottom edge of the electrode section 64 of the electrode pattern 63 or 66. This configuration achieves a higher displacement output of the piezoelectric actuator. Similar modifications may be also applied to the first through fourth embodiments. The number and arrangement of the drive columns or the number of green sheets for the electrode sheet block or blank sheet block may be arbitrarily selected in accordance with the design of the actuator.

Sixth Embodiment

Figure 10A:
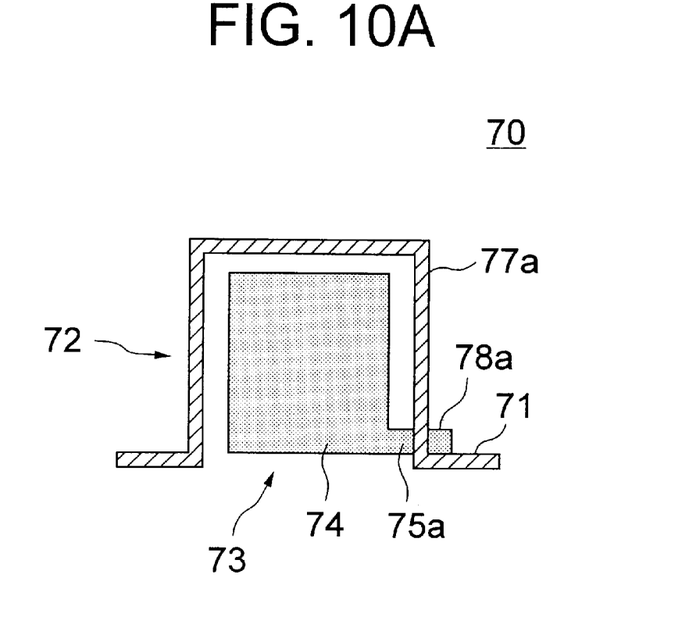
FIGS. 10A and 10B are top plan views of piezoelectric green sheets having a common electrode pattern and a signal electrode pattern, respectively, in a piezoelectric actuator according to a sixth embodiment of the present invention.
Figure 10B:
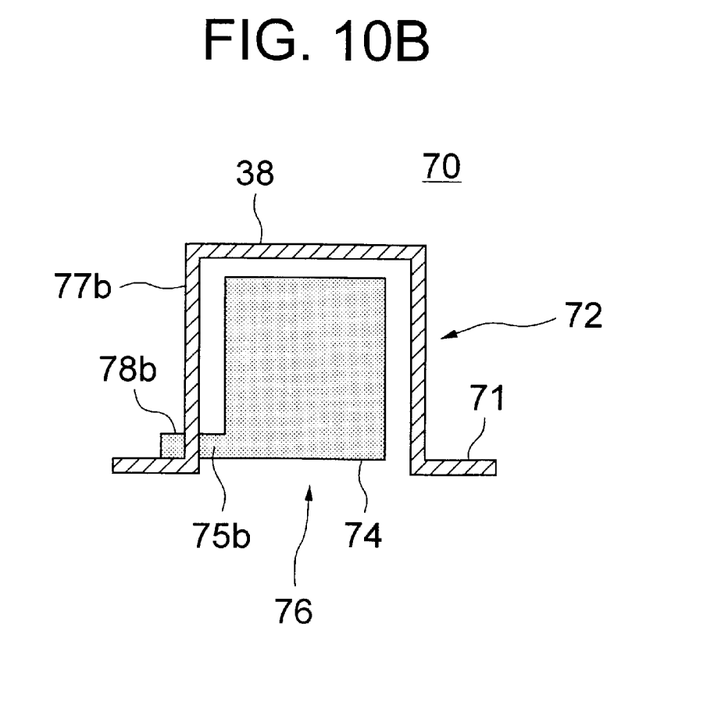

A piezoelectric actuator according to a sixth embodiment is similar to the first embodiment except that the lead section is exposed from the side surfaces of the drive columns. Specifically, referring to FIG. 10A showing a common electrode pattern 73 in a drive column 72 and FIG. 10B showing a signal electrode pattern 76 in the drive column 72, the common electrode pattern 73 has a drive electrode section 74 and a lead section 76a having an edge exposed at a side surface 77a of the drive column 72, whereas the signal electrode pattern 76 has a drive electrode section 74 and a signal lead section 75b having an edge exposed at the opposite side surface 77b of the drive column 72. The common lead sections 75a and the signal lead sections 75b are connected with respective external electrodes 78a and 78b by application of silver paste. The piezoelectric actuator 70 of the present embodiment achieves advantages similar to those in the fifth embodiment.

Since the above embodiments are described only for examples, the present invention is not limited to the above embodiments and various modifications or alterations can be easily made therefrom by those skilled in the art without departing from the scope of the present invention.

What is claimed is:

1. A piezoelectric actuator comprising:

a base; and an array of drive columns arranged on said base, wherein said base and said drive columns are rhombic, and said drive columns are arranged in directions parallel to sides of said rhombic base, each of said drive columns having a top surface for outputting a displacement force by a transverse piezoelectric effect, and an external common electrode and an external signal electrode for each of said drive columns, each of said drive columns being formed in a unitary body with an underlying portion of said base by a first block of a plurality of green sheets made of a piezoelectric material and stacked together, said green sheets including first green sheets each having thereon a common electrode pattern in electrical contact with said external common electrode and second green sheets each having thereon a signal electrode pattern in electrical contact with said external signal electrode.

* * * * *